United States Patent
Fiedorowicz et al.

(10) Patent No.: US 6,469,310 B1
(45) Date of Patent: Oct. 22, 2002

(54) RADIATION SOURCE FOR EXTREME ULTRAVIOLET RADIATION, E.G. FOR USE IN LITHOGRAPHIC PROJECTION APPARATUS

(75) Inventors: Henryk Fiedorowicz, Warszawa (PL); Frederik Bijkerk, Amsterdam; Cornelis C. De Bruijn, Sprundel, both of (NL); Andrzej Bartnik, Warszawa (PL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 09/466,217

(22) Filed: Dec. 17, 1999

(51) Int. Cl.$^7$ ............................ G21K 5/10; H01J 37/08; H01J 35/00; G21G 4/00
(52) U.S. Cl. .................................. 250/492.22; 378/119
(58) Field of Search ................................ 378/119, 127, 378/122

(56) References Cited

U.S. PATENT DOCUMENTS

| | | |
|---|---|---|
| 4,494,043 A | 1/1985 | Stallings et al. |
| 4,635,282 A | 1/1987 | Okada et al. |
| 4,663,567 A | 5/1987 | Wong |
| 4,771,447 A | 9/1988 | Saitoh et al. |
| 5,577,092 A | 11/1996 | Kublak et al. |
| 5,763,930 A | 6/1998 | Partlo |
| 5,910,847 A * | 6/1999 | Van der Werf et al. ..... 356/401 |
| 6,002,744 A * | 12/1999 | Hertz et al. ................. 378/119 |
| 6,065,203 A | 5/2000 | Haas et al. |
| 6,075,838 A * | 6/2000 | McGeoch .................... 378/119 |
| 6,105,885 A | 8/2000 | Haas et al. |

FOREIGN PATENT DOCUMENTS

WO    WO 99/34395    7/1999

OTHER PUBLICATIONS

Baksht et al., "Electromagnet Valve for a Multilayer–Puff Nozzle, " *Instruments and Experimental Techniques* 41(4):536–538 (1988).

Sze et al., "Initial results of an argon Z pinch using a double–shell gas puff," *Physics of Plasma* 7(10):4223–4226 (2000).

A copy of European Search Report issued in the corresponding European application.

* cited by examiner

*Primary Examiner*—Jack Berman
*Assistant Examiner*—Johnnie L Smith, II
(74) *Attorney, Agent, or Firm*—Pillsbury Winthrop LLP

(57) ABSTRACT

A radiation source of a radiation system of a lithographic projection apparatus includes a primary jet nozzle 10 constructed and arranged to eject a primary gas or liquid 15 in a first direction; a supply 11 for the primary gas or liquid which is to be brought into an excited energy state when ejected from the primary nozzle 10 and is to emit ultraviolet electromagnetic radiation when falling back to a lower energy state; an exciting mechanism such as a laser 30 for bringing the primary gas or liquid into the excited energy state; a secondary jet nozzle 20 constructed and arranged to eject a secondary gas or liquid 25 in the first direction and positioned aside, possibly enclosing, the primary jet nozzle 10; and a supply 21 for the secondary gas or liquid.

17 Claims, 3 Drawing Sheets

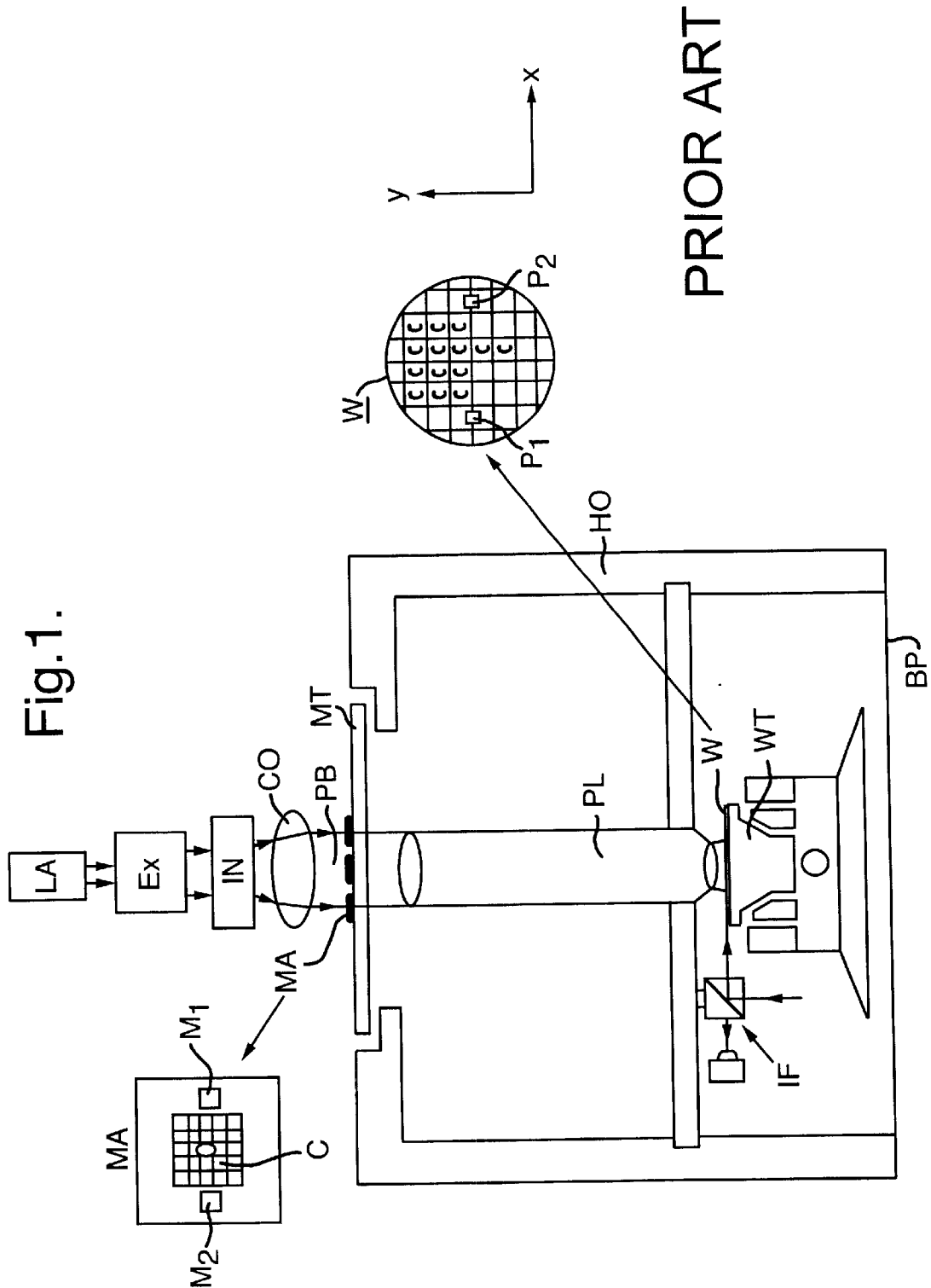

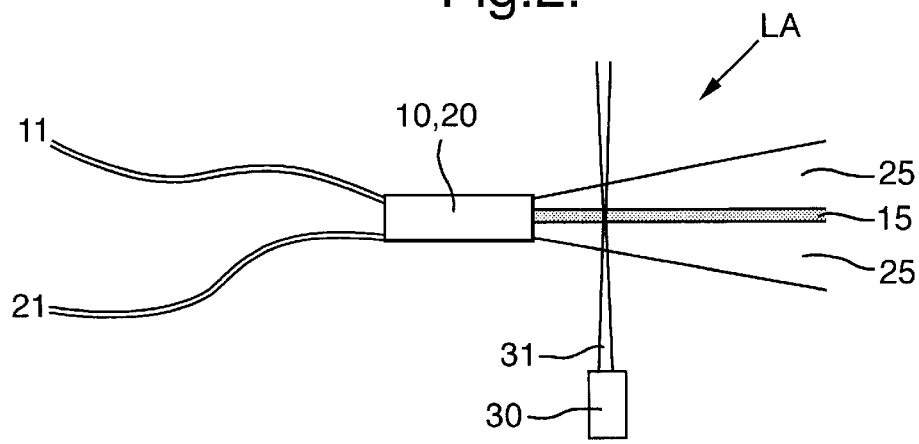
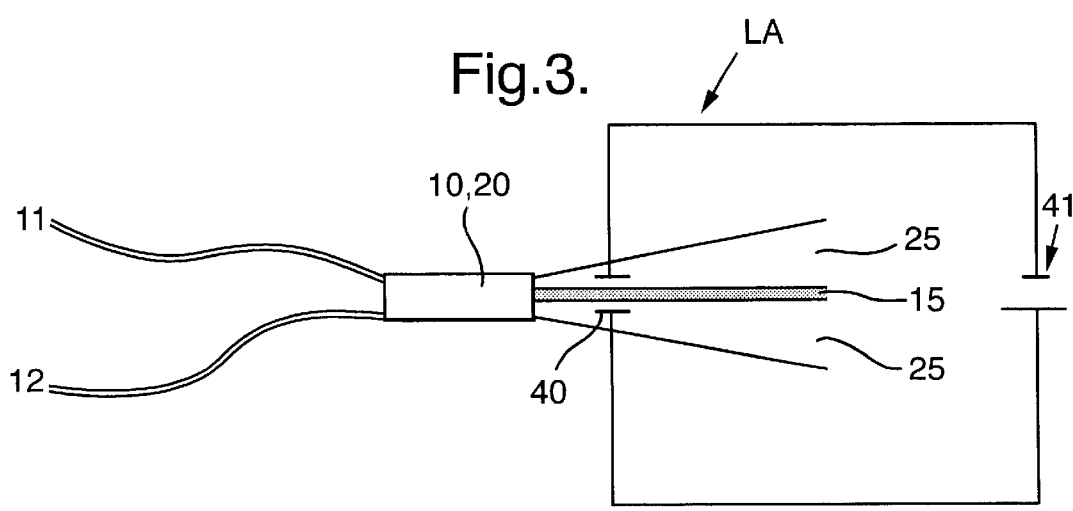
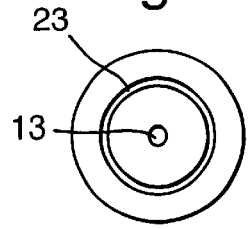 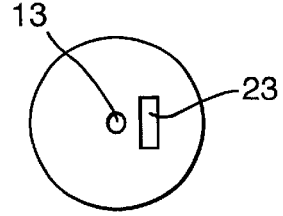

RADIATION SOURCE FOR EXTREME ULTRAVIOLET RADIATION, E.G. FOR USE IN LITHOGRAPHIC PROJECTION APPARATUS

BACKGROUND OF THE INVENTION

The invention relates to a radiation source for extreme ultraviolet electromagnetic radiation. More particularly, the invention relates to the use of the radiation source in a lithographic projection apparatus for imaging of a mask pattern in a mask onto a substrate.

A lithographic projection apparatus can be used, for example, in the manufacture of integrated circuits (ICs). In such a case, the mask (reticle) may contain a circuit pattern corresponding to an individual layer of the IC, and this pattern can then be imaged onto a target area (die) on a substrate (silicon wafer) which has been coated with a layer of photosensitive material (resist). In general, a single wafer will contain a whole network of adjacent dies which are successively irradiated through the reticle, one at a time. In one type of lithographic projection apparatus, each die is irradiated by exposing the entire reticle pattern onto the die in one go; such an apparatus is commonly referred to as a waferstepper. In an alternative apparatus—which is commonly referred to as a step-and-scan apparatus—each die is irradiated by progressively scanning the reticle pattern under the projection beam in a given reference direction (the "scanning" direction) while synchronously scanning the wafer table parallel or anti-parallel to this direction; since, in general, the projection system will have a magnification factor M (generally<1), the speed at which the wafer table is scanned will be a factor M times that at which the reticle table is scanned. More information with regard to lithographic devices as here described can be gleaned from International Patent Application WO 97/33205.

Up to very recently, apparatus of this type contained a single mask table and a single substrate table. However, machines are now becoming available in which there are at least two independently movable substrate tables; see, for example, the multi-stage apparatus described in International Patent Applications WO 98/28665 and WO 98/40791. The basic operating principle behind such multi-stage apparatus is that, while a first substrate table is underneath the projection system so as to allow exposure of a first substrate located on that table, a second substrate table can run to a loading position, discharge an exposed substrate, pick up a new substrate, perform some initial alignment measurements on the new substrate, and then stand by to transfer this new substrate to the exposure position underneath the projection system as soon as exposure of the first substrate is completed, whence the cycle repeats itself; in this manner, it is possible to achieve a substantially increased machine throughput, which in turn improves the cost of ownership of the machine. The apparatus may also have more than one mask table and may comprise components which are operated in vacuum, and are correspondingly vacuum-compatible.

Lithographic apparatus may employ various types of projection radiation, such as ultraviolet light (UV), extreme UV, X-rays, ion beams or electron beams, for example. Depending on the type of radiation used and the particular design requirements of the apparatus, the projection system may be refractive, reflective or catadioptric, for example, and may comprise vitreous components, grazing-incidence mirrors, selective multi-layer coatings, magnetic and/or electrostatic field lenses, etc; for simplicity, such components may be loosely referred to in this text, either singly or collectively, as a "lens".

To fulfill the demand for constantly decreasing dimensions (line widths) in the manufacture of ICs, a radiation source yielding radiation with smaller wavelengths is required. In a lithographic apparatus, the size of the features that can be imaged onto the wafer is limited by the wavelength of the projection radiation. To produce integrated circuits with a higher density of devices and hence higher operating speeds, it is desirable to be able to image smaller features. Whilst most current lithographic apparatus employ ultraviolet light generated by mercury lamps or excimer lasers, it has been proposed to use higher frequency (energy) radiation such as extreme ultraviolet (EUV) radiation. At the moment radiation sources for EUV radiation are investigated, for instance, generating electromagnetic radiation having a wavelength in the order of 10 nm. One of the sources under investigation comprises a primary jet nozzle for ejecting a flow of a primary gas or liquid. The primary gas or liquid is then brought into an excited energy state by means of, for instance, irradiation by a laser or generation of an electrical discharge. Other means for generating the excited energy state may, however, also be employed. A laser used should have a suitable laser frequency and a suitable intensity. An electrical discharge may be generated in the primary gas or liquid by a strong electrical field between electrodes connected to a source of high electrical potential. In general, the excited energy state will be a plasma in which electrons are detached from atoms of the primary gas or liquid. Recombination of electrons and atoms will occur under the emittance of electromagnetic radiation. The electromagnetic radiation will comprise a major contribution in the EUV range of the radiation spectrum when a suitable primary gas or liquid is selected at appropriate laser or electrical excitation conditions. Having a reliable EUV radiation source yielding a high brightness is very important in lithographic projection apparatus.

Below, reference will mainly be made to a primary gas and a primary gas jet nozzle. It is to be understood that the radiation source may also comprise a primary liquid jet nozzle for a primary liquid.

An EUV radiation source only comprising a primary gas jet nozzle has a strongly diverging flow of the primary gas from the nozzle outlet, implying that the density of the primary gas strongly decreases with increasing distance to the nozzle outlet. To reach a sufficiently high EUV radiation brightness, the plasma is to be created in a rather confined high density region of the flow of gas, i.e. very close to the nozzle outlet. A major drawback of creating a plasma close to the nozzle outlet is that the plasma will interact with the nozzle, causing debris production from the nozzle. The debris production from the nozzle causes, besides a shortened nozzle lifetime, a shortened lifetime of, for instance, a condenser system for the radiation source by a deposition of debris on its constituting optical elements such as lenses and mirrors. Especially for an EUV radiation source the optical elements are very sensitive for a deposition of debris.

Another drawback of the known primary gas jet nozzle source is that plasma particulates may escape from the plasma region. These escaped plasma particulates may thermalize and neutralize at, for instance, the optical elements of the condenser system of the radiation source, which even further decreases the lifetime of the optical elements and the condenser system.

SUMMARY OF THE INVENTION

An object of the present invention is to provide an improved EUV radiation source which avoids and alleviates the drawbacks of the radiation source referred to.

According to the present invention a radiation source for extreme ultraviolet electromagnetic radiation includes:

a primary jet nozzle constructed and arranged to eject a primary gas or liquid in a first direction;

a supply for the primary gas or liquid which is to be brought into an excited energy state when ejected from the primary nozzle and is to emit ultraviolet electromagnetic radiation when falling back to a lower energy state;

an exciting mechanism for bringing the primary gas or liquid into the excited energy state;

a secondary jet nozzle constructed and arranged to eject a secondary gas or liquid in the first direction and positioned aside the primary jet nozzle; and a supply for the secondary gas or liquid.

By having a secondary jet nozzle aside the primary jet nozzle the degree of divergence of the primary gas may be decreased by the outflow of the secondary gas from the secondary jet nozzle. Since a sufficient density in the primary gas will then be present at a larger distance from the jet nozzle outlet, the plasma can thus be created at the larger distance from the nozzle outlet. This prevents the production of debris and its associated problems mentioned above. Further, the radiation source may be positioned such that the outflow of secondary gas will function as a shield in between optical elements and the plasma created. Such a shield will largely prevent the escape of plasma particulates towards said optical elements. The particulates do not pass the screening secondary gas and are prevented from reaching any optical elements where they may cause damaging effects by thermalization and neutralization. Also, a radiation source having a reduced re-absorption of emitted radiation and an increased brightness is obtained, since the primary jet is prevented from expanding into the direction of the optical elements, such as multi-layer and grazing incident optics.

In a preferred embodiment the secondary jet nozzle encloses the primary jet nozzle. Such a configuration will yield an even better control over the divergence of the primary gas, and an outflow of the primary gas, which is parallel or even convergent over a certain distance from the nozzle outlet can be obtained. The secondary gas enclosing the primary gas and a plasma created therein also further prevents the escape of plasma particulates from the plasma. In an optimal configuration the primary and secondary jet nozzles are co-axial.

In an efficient EUV radiation source the primary gas may comprise at least one gas selected from the group comprising krypton and xenon, or the primary liquid may comprise a liquid selected from the group comprising water droplets and cryogenic liquids such as, for instance, liquid xenon. The secondary gas may comprise at least one gas selected from the group comprising helium, neon, argon, krypton, methane, silane and hydrogen. Hydrogen is the preferred secondary gas since it has superior absorption characteristics with respect to EUV radiation. It may thus be used in a large flow rate (high local density in the outflow), yielding a very efficient confinement of the primary gas for divergence control and screening of the plasma.

The present invention also provides a lithographic projection apparatus for imaging of a mask pattern in a mask onto a substrate and includes:

a radiation system for supplying a projection beam of radiation and comprising a radiation source;

a mask table provided with a mask holder for holding a mask;

a substrate table provided with a substrate holder for holding a substrate; and a projection system for imaging an irradiated portion of the mask onto a target portion of the substrate, wherein in that the radiation system comprises the radiation source described above.

According to yet a further aspect of the invention there is provided a method of manufacturing a device using a lithographic projection apparatus which includes:

a radiation system for supplying a projection beam of radiation and comprising a radiation source;

a mask table provided with a mask holder for holding a mask;

a substrate table provided with a substrate holder for holding a substrate; and a projection system for imaging an irradiated portion of the mask onto a target portion of the substrate, The method includes:

providing a mask bearing a pattern to the mask table;

providing a substrate which is at least partially covered by a layer of radiation-sensitive material to the substrate table; and using the projection beam of irradiation to project an image of at least a portion of the mask pattern onto a target portion on the substrate, characterized in that a radiation source as described above is used in the radiation system for supplying the projection beam of radiation.

In a manufacturing process using a lithographic projection, a pattern in a mask is imaged onto a substrate which is at least partially covered by a layer of energy-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

Although specific reference has been made hereabove to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target area", respectively.

DESCRIPTION OF THE DRAWINGS

The invention and its attendant advantages will be further elucidated with the aid of exemplary Embodiments and the accompanying schematic drawings, in which like reference numerals indicate like parts, and in which:

FIG. 1 depicts a lithographic projection apparatus according to the invention;

FIG. 2 depicts an embodiment of the radiation source according to the invention;

FIG. 3 depicts another embodiment of the radiation source according to the invention;

FIG. 6 depicts a front view of the nozzle source of FIG. 4 or 5; and

FIG. 7 depicts a front view of yet another embodiment of the nozzle source according to the invention.

DETAILED DESCRIPTION

Embodiment 1

Figure 4:
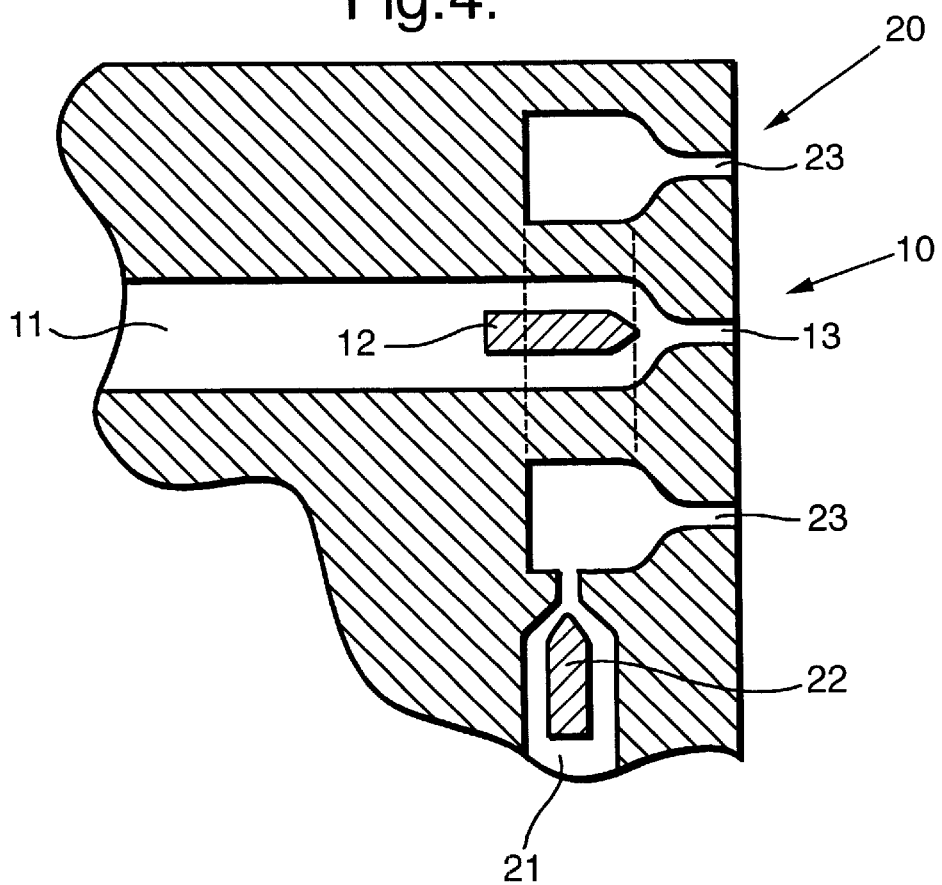
FIG. 4 depicts a longitudinal section through a pulsed jet nozzle source of the embodiments of FIGS. 2 or 3.

FIG. 1 schematically depicts a lithographic projection apparatus according to the invention. The apparatus comprises:
- a radiation system LA, Ex, IN, CO for supplying a projection beam PB of extreme ultraviolet radiation (e.g. with a wavelength of about 10 nm);
- a mask table MT provided with a mask holder for holding a mask MA (e.g. a reticle);
- a substrate table WT provided with a substrate holder for holding a substrate W (e.g. a resist-coated silicon wafer); and
- a projection system PL for imaging an irradiated portion of the mask MA onto a target portion C (die) of the substrate W.

The radiation system comprises a radiation source LA which produces a beam of radiation. This beam is passed along various optical components,—e.g. beam shaping optics Ex, an integrator IN and a condenser CO—so that the resultant beam PB is substantially collimated and uniformly intense throughout its cross-section.

The beam PB subsequently intercepts the mask MA which is held in a mask holder on a mask table MT. Having passed through the mask MA, the beam PB passes through the projection system PL, which focuses the beam PB onto a target area C of the substrate W. With the aid of the interferometric displacement and measuring means IF, the substrate table WT can be moved accurately, e.g. so as to position different target areas C in the path of the beam PB.

The condenser CO and the projection system PL are schematically shown as refractive components in FIG. 1. In practice, however, they will generally comprise reflective components for a beam of extreme ultraviolet radiation. The components shown in FIG. 1 should only be considered as a schematic representation.

The depicted apparatus can be used in two different modes:
1. In step mode, the mask table MT is fixed, and an entire mask image is projected in one go (i.e. a single "flash") onto a target area C. The substrate table WT is then shifted in the x and/or y directions so that a different target area C can be irradiated by the (stationary) beam PB; and
2. In scan mode, essentially the same scenario applies, except that a given target area C is not exposed in a single "flash". Instead, the mask table MT is movable in a given direction (the so-called "scan direction", e.g. the x direction) with a speed v, so that the projection beam PB is caused to scan over a mask image; concurrently, the substrate table WT is simultaneously moved in the same or opposite direction at a speed V=Mv, in which M is the magnification of the projection system PL (typically, M=¼ or ⅕). In this manner, a relatively large target area C can be exposed, without having to compromise on resolution.

FIG. 2 schematically shows a radiation source LA of the radiation system, comprising primary and secondary jet nozzles 10 and 20 and a supply of primary and secondary gases 11 and 21 to the primary and secondary jet nozzles, respectively. Both jet nozzles are in the embodiment shown pulsed jet nozzles, in which both supply lines comprise valves which are opened at certain instants in time to supply a pulse of primary and secondary gases to the respective jet nozzles. The outflow of the primary and secondary gasses is designated by the reference numerals 15 and 25, respectively, in FIG. 2

FIG. 2 further shows a laser 30 for supplying a laser beam 31, which in general will be a pulsed laser beam. The laser beam 31 is directed to and focussed in the outflow of the primary gas from its jet nozzle 10. The frequency of the light in the laser beam and the intensity of the laser beam are chosen such that a plasma will be created in the region in which the laser beam 31 crosses the outflow of the primary gas 15. In the plasma electrons are detached from the atoms of the primary gas. After some time the electrons and nuclei will recombine under the emission of electromagnetic radiation which may have a large contribution in the extreme ultraviolet range of the radiation spectrum. The electromagnetic radiation is collected and redirected by optical elements, such as a condenser system, and not shown in FIG. 2.

FIG. 4 shows a longitudinal section through the jet nozzle source for the primary and secondary gases. FIG. 6 shows a front view of the nozzle source. The primary and secondary jet nozzles are arranged co-axial, the secondary jet nozzle 20 enclosing the primary jet nozzle 10. The primary jet nozzle 10 has a circular outlet 13 and the secondary nozzle 20 has a annular outlet 23. Plungers 12 and 22 are arranged in the supply of the primary and secondary gases 11 and 21, respectively, and may be independently operated to close of their respective supply by abutting against a tapered end of the supply. In this way valves are obtained for opening and closing the respective supplies to yield a pulsed outflow of the primary and secondary gasses. However, pulsed nozzles may be obtained in various other configurations. The plungers 12, 22 are operated by means which are not shown in the drawings.

When a pulse of primary gas and no pulse of secondary gas is ejected from the nozzle source, the outflow of the primary gas 15 from the jet nozzle outlet 13 will be strongly divergent. Also ejecting a pulse of secondary gas 25 results in a less divergent or even parallel or convergent outflow of the primary gas 15. An optimum outflow of the primary gas for the radiation source can be reached by varying one or more of several parameters. One of these parameters is the supply rate of secondary gas to the secondary jet nozzle 20 with respect to the supply rate of primary gas to the primary jet nozzle 10. Another parameter is the timing of the pulse of secondary gas with respect to the timing of the pulse of primary gas. It appears that an appropriately delayed pulse of primary gas with respect to the pulse of secundary gas results in a less divergent beam in case the secondary gas is a lighter gas than the primary gas as compared to a non-delayed pulse at the same flow rates of primary and secondary gasses. Other relevant parameters are the backing pressures of the gases in the nozzle source and the jet geometry. The optimum parameters will depend on the gases or liquids used and on the specific geometry of the primary and secondary jet nozzles.

The primary gas of the first embodiment of the radiation source comprises krypton or xenon, which may be supplied pure or in a mixture with other (inert) gases. A xenon plasma, for instance, has been shown to emit a large contribution of extreme ultraviolet radiation. In an alternative embodiment water droplets or cryogenic liquids, such as liquid xenon, in a carrier gas may be used as a primary liquid. The secondary gas may be selected from the group comprising helium, neon, argon, krypton, methane, silane and hydrogen.

In the preferred embodiment the secondary gas is hydrogen, because hydrogen hardly absorbs extreme ultraviolet radiation. Since hydrogen has favorable absorption characteristics with respect to extreme ultraviolet radiation, a very large outflow of hydrogen from the secondary nozzle can be employed, resulting in a high local density in the outflow. A lighter secondary gas is expected to yield a worse confinement of xenon as a primary gas with respect to a heavier secondary gas due to a smaller transfer of momentum in a collision. The much larger outflow and higher pressure of hydrogen which can be employed in the radiation source according to the invention overcompensates for the smaller mass of hydrogen with respect other secondary gasses, due to the considerably larger local pressures which can be tolerated.

With the above jet nozzles an approximate parallel outflow of the primary gas from the primary jet nozzle 10 may be obtained. The laser beam 31 of the laser 30 for creating a plasma in the primary gas is crossed with and focussed in the outflow of primary gas at a distance from the nozzle outlet which is sufficient not to produce debris from the jet nozzle by interaction of the plasma with the nozzle.

Embodiment 2

Figure 5:
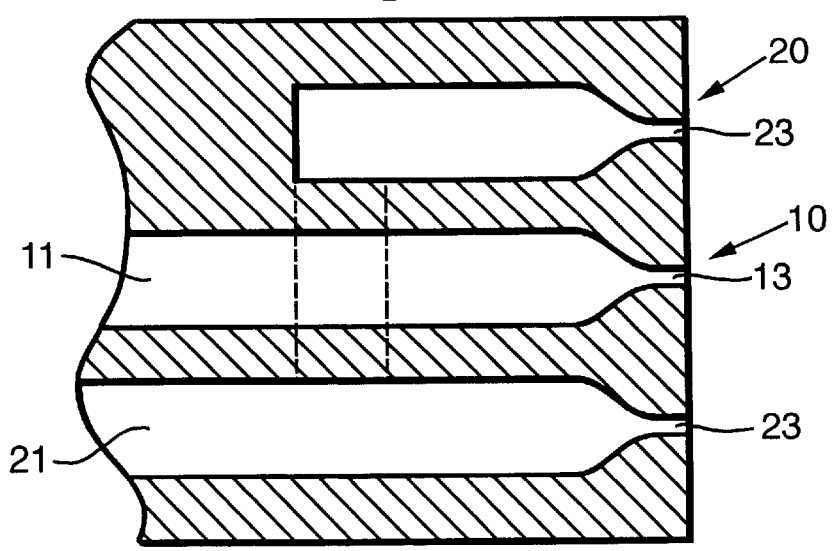
FIG. 5 depicts a longitudinal section through a continuous jet nozzle source.

FIG. 5 schematically shows another configuration for the nozzle source of the radiation source according to a second embodiment of the invention. The second embodiment differs from the first in that it comprises a continuous nozzle source for a continuous outflow of primary and secondary gasses from the respective outlets 13 and 23 of the primary and secondary jet nozzles 10 and 20. An embodiment comprising a continuous jet nozzle for the primary jet nozzle and a pulsed nozzle for the secondary jet nozzle, or vice versa, may also be envisaged.

Embodiment 3

FIG. 7 schematically shows a front view of a nozzle source of a radiation source according to a third embodiment of the invention. The third embodiment differs from the first and second embodiment in that the secondary nozzle is positioned at one side of the primary nozzle. The figure shows the outlets 13 and 23 of the primary and secondary jet nozzles, respectively. The divergence of the outflow from the primary nozzle may for this embodiment only controlled at this one side. Shielding of a plasma created in the primary gas will also only be present at this one side. An embodiment in which the secondary jet nozzle partly encloses the primary jet nozzle, or having, for instance, outlets of the secondary jet nozzle on two opposite sides of the outlet of the primary jet nozzle may also be envisaged.

Embodiment 4

FIG. 3 schematically shows another embodiment of the radiation source according to the invention. The fourth embodiment differs from the first, second and third embodiment in that the plasma in the outflow of the primary gas from the nozzle is created by an electrical discharge in the primary gas ejected from the primary nozzle 10. The discharge is generated in between electrodes 40 which are connected to a high voltage source 41. However, other means for creating a plasma in the outflow of the primary gas may also be employed.

Whilst specific embodiments of the invention are disclosed above it will be appreciated that the invention may be practiced other than described. The description is not intended to limit the invention.

What is claimed is:

1. Radiation source for extreme ultraviolet electromagnetic radiation, said radiation source comprising:
   a primary jet nozzle constructed and arranged to eject a primary gas or liquid in a first direction;
   a supply for the primary gas or liquid which is to be brought into an excited energy state when ejected from the primary nozzle and is to emit ultraviolet electromagnetic radiation when falling back to a lower energy state;
   an exciting mechanism constructed and arranged to bring the primary gas or liquid into the excited energy state;
   a secondary jet nozzle constructed and arranged to eject a secondary gas or liquid in said first direction and positioned aside the primary jet nozzle; and
   a supply for the secondary gas or liquid.

2. Radiation source according to claim 1, wherein the secondary jet nozzle encloses the primary jet nozzle.

3. Radiation source according to claim 2, wherein the primary and secondary jet nozzles are co-axial.

4. Radiation source according to claim 1, wherein the primary gas comprises at least one gas selected from the group comprising krypton and xenon.

5. Radiation source according to claim 1, wherein the primary liquid comprises a liquid selected from the group comprising water droplets and cryogenic liquids.

6. Radiation source according to claim 1, wherein the secondary gas comprises at least one gas selected from the group comprising helium, neon, argon, krypton, methane, silane and hydrogen.

7. Radiation source according to claim 6, wherein the secondary gas comprises hydrogen.

8. Radiation source according to claim 1, wherein at least one of the jet nozzles is a continuous jet nozzle.

9. Radiation source according to claim 1, wherein at least one of the jet nozzles is a pulsed jet nozzle.

10. Radiation source according to claim 1, wherein at least one of the jet nozzles is a super-sonic jet nozzle.

11. Radiation source according to claim 1, wherein the excited state is a plasma.

12. Radiation source according to claim 1, wherein the exciting mechanism comprises a laser.

13. Radiation source according to claim 1, wherein the exciting mechanism comprises electrodes connected to a source of high electrical potential and constructed and arranged to create an electrical discharge in the primary gas or liquid.

14. A lithographic projection apparatus for imaging of a mask pattern in a mask onto a substrate, said apparatus comprising:
   a radiation system for supplying a projection beam of radiation and comprising a radiation source, said radiation source comprising:
     a primary jet nozzle constructed and arranged to eject a primary gas or liquid in a first direction;
     a supply for the primary gas or liquid which is to be brought into an excited energy state when ejected from the primary nozzle and is to emit ultraviolet electromagnetic radiation when falling back to a lower energy state;

an exciting mechanism constructed and arranged the primary gas or liquid into the excited energy state;

a secondary jet nozzle constructed and arranged to eject a secondary gas or liquid in said first direction and positioned aside the primary jet nozzle; and a supply for the secondary gas or liquid;

a mask table provided with a mask holder for holding a mask;

a substrate table provided with a substrate holder for holding a substrate; and a projection system for imaging an irradiated portion of the mask onto a target portion of the substrate.

15. A method of manufacturing a device using a lithographic projection apparatus comprising:

a radiation system for supplying a projection beam of radiation and comprising a radiation source;

a mask table provided with a mask holder for holding a mask;

a substrate table provided with a substrate holder for holding a substrate; and a projection system for imaging an irradiated portion of the mask onto a target portion of the substrate, said method comprising:

providing a mask bearing a pattern to said mask table;

providing a substrate which is at least partially covered by a layer of radiation-sensitive material to said substrate table; and using the projection beam of irradiation to project an image of at least a portion of the mask pattern onto a target portion on the substrate, characterized in that a radiation source according claim 1 is used in the radiation system for supplying the projection beam of radiation.

16. A device manufactured according to the method of claim 15.

17. A method for generating extreme ultraviolet electromagnetic radiation comprising:

providing a primary gas or liquid that emits ultraviolet electromagnetic radiation when falling from an excited energy state to a lower energy state;

creating a first stream of the primary gas or liquid;

providing a secondary gas or liquid;

creating a second stream of the secondary gas or liquid adjacent to the first stream of the primary gas or liquid to limit the degree of divergence of the first stream of the primary gas or liquid; and raising the energy level of the primary gas or liquid to the excited energy state.

* * * * *